United States Patent
Lin

(10) Patent No.: US 10,825,542 B1
(45) Date of Patent: Nov. 3, 2020

(54) METHOD FOR EFFICIENTLY CHECKING STORAGE UNITS OF FLASH MEMORY OF FLASH MEMORY DEVICE AND CORRESPONDING ELECTRONIC DEVICE EXECUTING THE METHOD

(71) Applicant: Silicon Motion Inc., Hsinchu County (TW)

(72) Inventor: Ching-Hui Lin, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 0 days.

(21) Appl. No.: 16/568,260

(22) Filed: Sep. 12, 2019

(51) Int. Cl.
*G11C 29/38* (2006.01)
*G11C 29/44* (2006.01)

(52) U.S. Cl.
CPC .............. *G11C 29/38* (2013.01); *G11C 29/44* (2013.01)

(58) Field of Classification Search
CPC .................................. G11C 29/38; G11C 29/44
See application file for complete search history.

(56) References Cited

U.S. PATENT DOCUMENTS

| | | | |
|---|---|---|---|
| 2009/0006911 A1* | 1/2009 | Wang ............... | G11B 20/10527 714/711 |
| 2013/0024605 A1* | 1/2013 | Sharon ............. | G06F 11/1044 711/103 |
| 2019/0227121 A1* | 7/2019 | Azam ................ | G11C 29/4401 |
| 2019/0324915 A1* | 10/2019 | Park ................. | G06F 12/0871 |

\* cited by examiner

*Primary Examiner* — Kyle Vallecillo
(74) *Attorney, Agent, or Firm* — Winston Hsu

(57) ABSTRACT

A method for checking storage units of flash memory of flash memory device includes: writing data into storage units; and performing data read operation to read data from storage units to compare read data with written data to check whether data is correctly written into storage units, and data read operation includes: performing sequential read operation to sequentially select first storage unit and to read data from first storage unit according to serial order numbers; determining whether first storage unit is damaged; accumulating a number of damaged storage units if first storage unit is damaged; determining whether the number of damaged storage units is larger than first threshold number; and exiting sequential read operation and performing random read operation to read data of specific storage unit if the number of damaged storage units is larger than first threshold number.

16 Claims, 3 Drawing Sheets

US 10,825,542 B1

METHOD FOR EFFICIENTLY CHECKING STORAGE UNITS OF FLASH MEMORY OF FLASH MEMORY DEVICE AND CORRESPONDING ELECTRONIC DEVICE EXECUTING THE METHOD

BACKGROUND OF THE INVENTION

1. Field of the Invention

The invention relates to a flash memory initialization mechanism, and more particularly to a method for checking storage units of a flash memory of a flash memory device and correspondingly an electronic device which can execute the method.

2. Description of the Prior Art

Generally speaking, a conventional flash memory initialization scheme is arranged to sequentially write data into and read data from storage units of a flash memory of a flash memory device when initializing a product of the flash memory device. For example, when reading data from a particular storage unit, the conventional flash memory initialization scheme is used to adjust different read voltages repeatedly if data of the particular storage unit is erroneous or not correct. The particular storage unit is determined as a damaged/bad storage unit only when all the adjusted read voltages cannot be used to correctly read data from the particular storage unit. However, this consumes more time. In addition, there is a great possibility that the performance of the conventional flash memory initialization scheme is limited due to a group of consecutive storage units which are actually damaged since the conventional flash memory initialization scheme is still arranged to read data from all the actually damaged storage units.

SUMMARY OF THE INVENTION

Therefore one of the objectives of the invention is to provide a method for checking storage units of a flash memory of a flash memory device and correspondingly an electronic device, to solve the above-mentioned problems and improve the efficiency.

According to embodiments of the invention, a method for checking storage units of a flash memory of a flash memory device is disclosed. The method comprises: writing data into the storage units; and performing a data read operation to read data from the storage units to compare the read data with the written data to check whether the data is correctly written into the storage units. The data read operation comprises: performing a sequential read operation to sequentially select a first storage unit and to read data from the first storage unit according to serial order numbers of the storage units; determining whether the first storage unit is damaged; accumulating a number of damaged storage units which are consecutive if the first storage unit is damaged; determining whether the number of damaged storage units is larger than a first threshold number; and exiting the sequential read operation and then performing a random read operation to read data of a specific storage unit if the number of damaged storage units is larger than the first threshold number, wherein the specific storage unit has a serial order number which is not consecutive to serial order numbers of the first portion of the storage units, a serial order number of the specific storage is not consecutive to a serial order number of the first storage unit.

According to the embodiments, an electronic device is disclosed. The electronic device comprises a memory, an interface circuit, and a processor. The interface circuit is coupled to the memory via an internal bus, and the interface circuit is to be coupled between the internal bus and a flash memory controller of a flash memory device which further comprises a flash memory. The processor is coupled to the memory and the interface circuit via the internal bus, and used for executing a storage unit checking process to control the flash memory controller to: write data into the storage units; and perform a data read operation to read data from the storage units to compare the read data with the written data to check whether the data is correctly written into the storage units. The data read operation comprises: performing a sequential read operation to sequentially select a first storage unit and to read data from the first storage unit according to serial order numbers of the storage units; determining whether the first storage unit is damaged; accumulating a number of damaged storage units which are consecutive if the first storage unit is damaged; determining whether the number of damaged storage units is larger than a first threshold number; and exiting the sequential read operation and then performing a random read operation to read data of a specific storage unit if the number of damaged storage units is larger than the first threshold number, wherein the specific storage unit has a serial order number which is not consecutive to serial order numbers of the first portion of the storage units, a serial order number of the specific storage is not consecutive to a serial order number of the first storage unit.

These and other objectives of the present invention will no doubt become obvious to those of ordinary skill in the art after reading the following detailed description of the preferred embodiment that is illustrated in the various figures and drawings.

DETAILED DESCRIPTION

The invention aims at providing a technical solution and process/method capable of improving the efficiency and speed of initializing a product of a flash memory device comprising a flash memory and a flash memory controller. Particularly, the provided technical solution and process/procedure are for example suitable for initializing a downgraded product of the flash memory device; however, this is not intended to be a limitation. For instance, the flash memory device totally may comprise $2^n$ gigabytes (GB) wherein n is a positive integer, and the downgraded product of such flash memory device may have fewer than $2^n$ gigabytes, e.g. only half of $2^n$ gigabytes, since a portion of the storage units (e.g. storage blocks, pages, or sectors) comprised by the flash memory of the flash memory device may be damaged and thus become bad storage units due to a variety of factors.

The provided technical solution and process is arranged to efficiently initialize the downgraded product of the flash memory device to check the storage units comprised within the flash memory by writing data into and reading data from the storage units before an expiration of a time limit. It should be noted that reading data from one storage unit sometimes needs to wait for a much longer time period since there is a possibility of changing and adjusting a read voltage for the storage unit. For example, a read voltage table may record eight different read voltages, and the operation of reading data from one storage unit may sequentially adjust the actual read voltage to read data from the storage unit according to the eight different read voltages. The storage unit is identified as a bad/damaged storage unit when all the eight different read voltages cannot correctly read data from the storage unit.

The provided technical solution and process can prevent the flash memory controller from continuously checking storage unit(s) which have/has a great possibility of being damaged storage unit(s) and equivalently can be used to check storage unit(s) which have/has a great possibility of being undamaged storage unit(s) as far as possible when initializing the flash memory device. Thus, the provided technical solution and process can make the initialized flash memory device have a larger total capacity as far as possible before the expiration of the time limit.

Figure 1A:
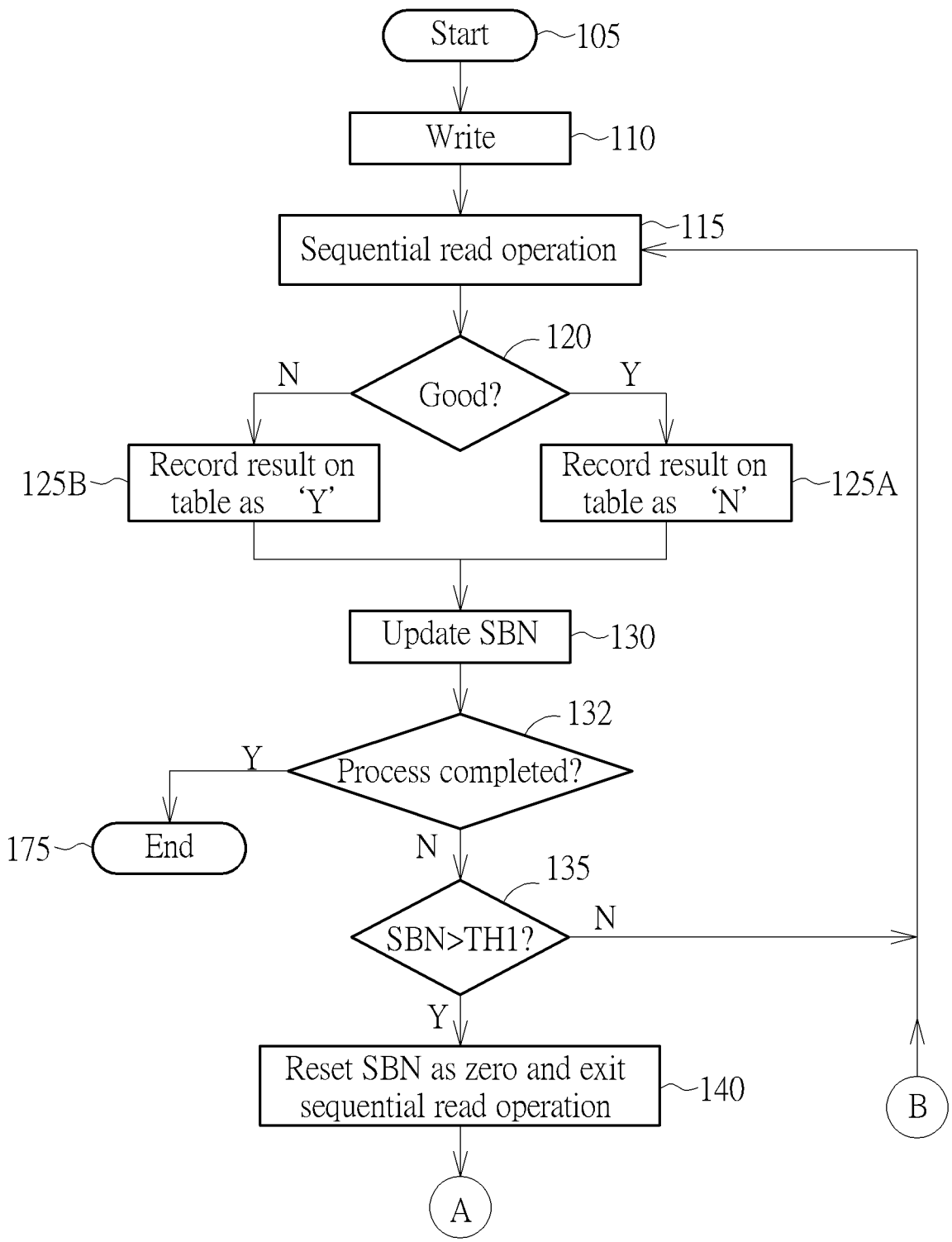
FIG. 1A is a diagram showing a portion of a flowchart of a storage unit checking process of a flash memory initialization procedure/process capable of rapidly checking storage units such as storage blocks or storage pages/sectors in a flash memory of a flash memory device so as to rapidly performing a flash memory initialization operation upon the flash memory of the flash memory device according to an embodiment of the invention.
Figure 1B:
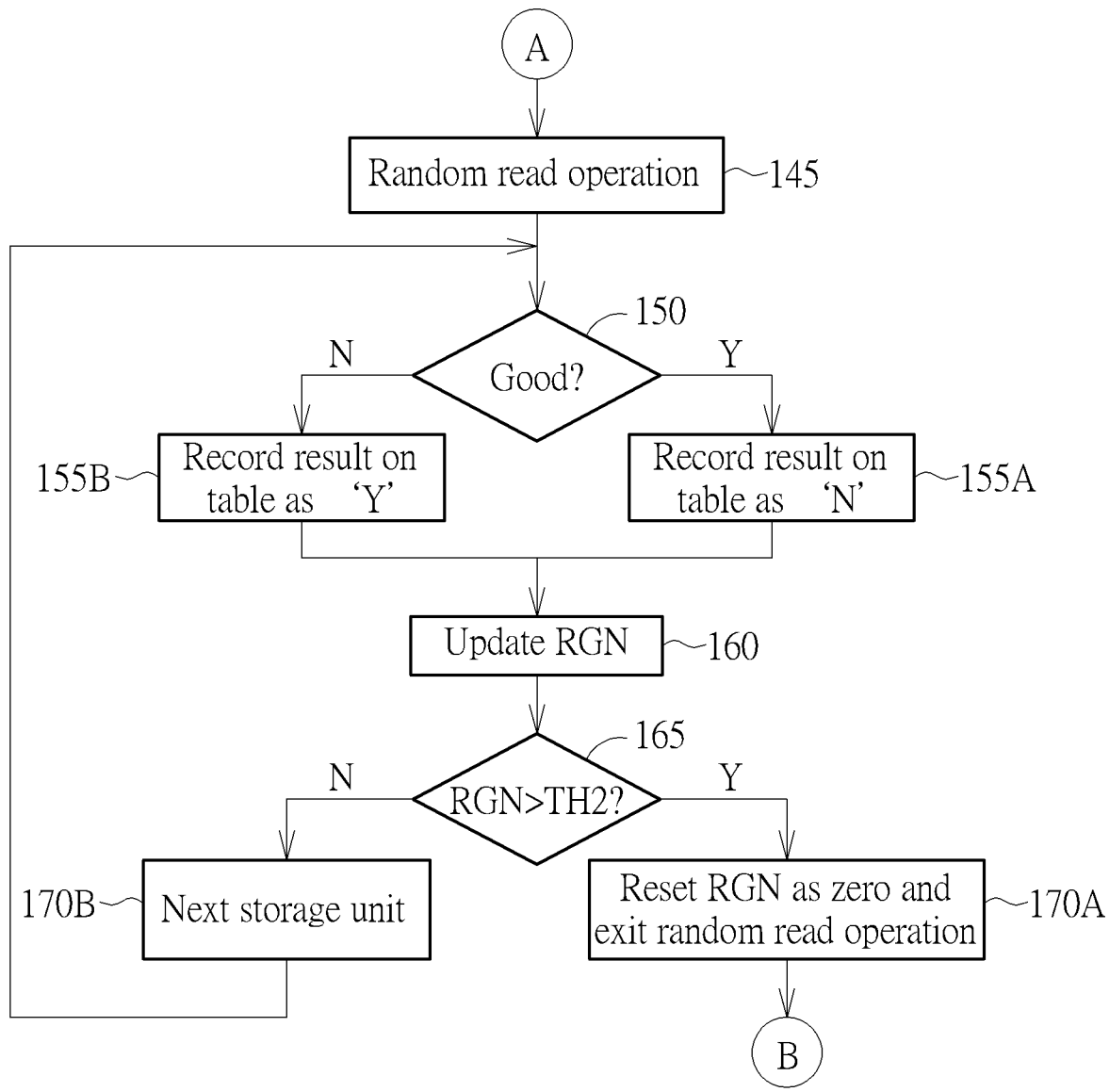
FIG. 1B is a diagram showing another portion of the flowchart of the storage unit checking process of the flash memory initialization procedure/process according to the embodiment of the invention.

Refer to FIGS. 1A and 1B. FIGS. 1A and 1B show a flowchart of a storage unit checking process of a flash memory initialization procedure/process capable of rapidly checking storage units such as storage blocks or storage pages/sectors in a flash memory of a flash memory device so as to rapidly performing a flash memory initialization operation upon the flash memory of the flash memory device according to an embodiment of the invention. Provided that substantially the same result is achieved, the steps of the flowchart shown in FIGS. 1A and 1B need not be in the exact order shown and need not be contiguous, that is, other steps can be intermediate. Steps are detailed in the following:

Step 105: Start;

Step 110: Write data into storage units of the flash memory;

Step 115: Perform the sequential read operation to sequentially select one storage unit from the storage units based on the serial order numbers of the storage units and then to read data from the selected storage unit;

Step 120: Compare the data read from the selected storage unit with the data originally written into the selected storage unit to determine whether the selected storage unit is a good storage unit or a bad storage unit; if the selected storage unit is a good storage unit, the flow proceeds to Step 125A, otherwise, the flow proceeds to Step 125B;

Step 125A: record the check result of the selected storage unit at a corresponding field of the selected storage unit on a bad storage unit check table as 'N' to indicate that the selected storage unit has been identified or checked as an undamaged storage unit;

Step 125B: record the check result of the selected storage unit at the corresponding field of the selected storage unit on the bad storage unit check table as 'Y' to indicate that the selected storage unit has been identified or checked as a damaged storage unit;

Step 130: Update a number SBN of damaged storage units which are consecutive;

Step 132: Determine whether the storage unit checking process is completed by comparing a number SUN of storage units which have been checked with the number of total storage units in the flash memory and/or based on whether the expiration of the time limit occurs; if the storage unit checking process is completed, the flow proceeds to Step 175, otherwise, the flow proceeds to Step 135;

Step 135: Determine whether the number SBN is larger than a threshold number TH1 to determine whether to exit the mode of sequential read operation; if the number SBN is larger than the threshold number TH1, the flow proceeds to Step 140, otherwise, the flow proceeds to Step 115;

Step 140: reset the number SBN as zero and exit the mode of sequential read operation;

Step 145: perform the random read operation to randomly select one storage unit from the remaining storage units based on a random serial order number and then to read data from the selected storage unit;

Step 150: Compare the data read from the selected storage unit with the data originally written into the selected storage unit to determine whether the selected storage unit is a good storage unit or a bad storage unit; if the selected storage unit is a good storage unit, the flow proceeds to Step 155A, otherwise, the flow proceeds to Step 155B;

Step 155A: record the check result of the selected storage unit at a corresponding field of the selected storage unit on the bad storage unit check table as 'N' to indicate that the selected storage unit has been identified or checked as an undamaged storage unit;

Step 155B: record the check result of the selected storage unit at the corresponding field of the selected storage unit on the bad storage unit check table as 'Y' to indicate that the selected storage unit has been identified or checked as a damaged storage unit;

Step 160: Update a number RGN of undamaged storage unit(s) starting from the randomly selected storage unit;

Step 165: Determine whether the number RGN is larger than a threshold number TH2 to determine whether to exit the mode of random read operation; if the number RGN is larger than the threshold number TH2, the flow proceeds to Step 170A, otherwise, the flow proceeds to Step 170B;

Step 170A: reset the number RGN as zero and exit the mode of random read operation to enter the mode of sequential read operation, and the flow proceeds to Step 115;

Step 170B: select a next storage unit having a serial order number next to that of the previously selected storage unit and then to read data from the selected storage unit, and the flow proceeds to Step 150; and Step 175: End.

Figure 2:
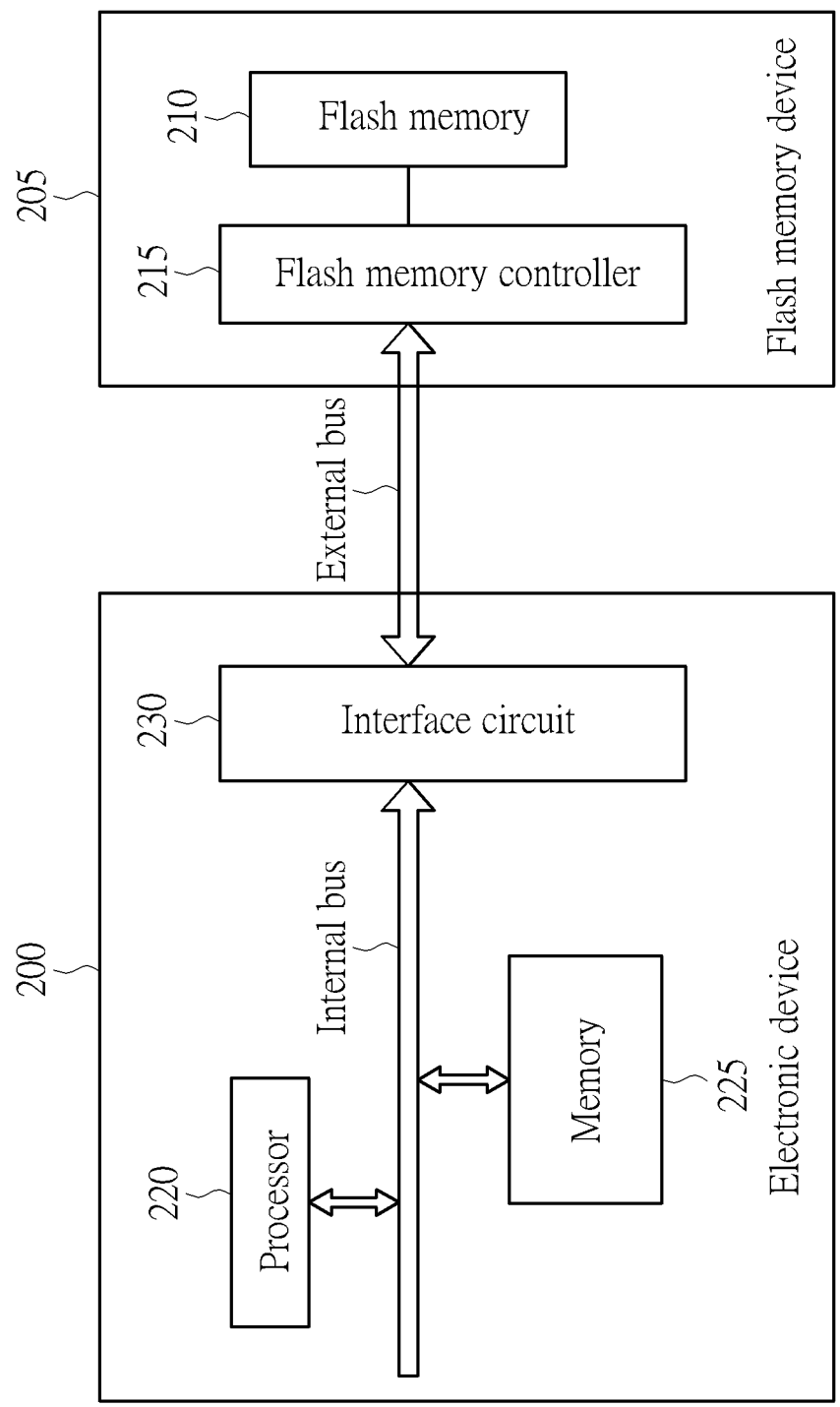
FIG. 2 is a block diagram of an electronic device executing or running the storage unit checking process of the flash memory initialization procedure/process in FIGS. 1A and 1B according to an embodiment of the invention.

Refer to FIG. 2. FIG. 2 is a block diagram of an electronic device 200 executing or running the storage unit checking process of the flash memory initialization procedure/process in FIGS. 1A and 1B to control a flash memory controller 215 to check a flash memory 210 when initializing the flash memory device 205 according to an embodiment of the invention. As shown in FIG. 2, the electronic device 200 for example is a computer device such as a personal computer device and comprises the processor 220 such as a central processing unit (CPU), a memory 225, and an interface circuit 230, which are coupled via the internal bus. The flash memory device 205 for example can be a flash memory card, security digital (SD) memory card, a solid-state drive (SSD), or any flash memory products.

When manufacturing and initializing the flash memory device 205 comprising the flash memory 210 and the flash memory controller 215 at a factory, the flash memory initialization process is implemented by using a software program package which is executed and ran on the processor 220. The processor 220 executes the software program package to send control commands from the interface circuit 230 such as USB interface circuit to the flash memory controller 215 via the external bus such as USB so as to control the flash memory controller 215 perform read/write operation upon the flash memory 210 to check storage units of the flash memory 210. Check result(s) of one or more storage units can be transmitted from the flash memory controller 215 back to the processor 220 via the external bus, interface circuit 230, and the internal bus. Accordingly, the processor 220 running the flash memory initialization process can obtain which portion of storage units is not damaged and a downgraded capacity of the flash memory device 205 if the device 205 is used as a downgraded flash memory product.

The storage unit checking process/method mentioned above is arranged to check whether storage units comprised by the flash memory 210 of the flash memory device 205 are good/undamaged storage units or bad/damaged storage units. The storage units for example can be storage blocks, storage pages, or storage sectors; this is not intended to be a limitation. For example, the flash memory 210 comprises multiple storage blocks each comprising multiple storage pages each comprising multiple storage sectors.

In practice, for reading data from the flash memory 210, the flash memory device 205 comprises a block mode and a page mode wherein the flash memory controller 215 of flash memory device 205 in the block mode is arranged to read data from the flash memory 210 in block units while the flash memory controller 215 of flash memory device 205 in the page mode is arranged to read data from the flash memory 210 in page units. In addition, in one embodiment, the flash memory device 205 may further comprise a sector mode in which the flash memory controller 215 can read data from the flash memory 210 in sector units.

For checking one or each storage unit, the flash memory initialization process is arranged to control the flash memory controller 215 to write data into the storage units and then to perform a data read operation to read data from the storage units to compare the read data with the written data to check whether the read data matches the written data. The data read operation comprises a mode of sequential read operation and a mode of random read operation. It should be noted that the flash memory initialization process may control the flash memory controller 215 to write data into one storage unit each time and then to perform the data read operation to read data from such storage unit to compare the read data with the written data to check whether the read data matches the written data. This is not meant to be a limitation. In the following paragraphs, to initialize the flash memory device 205, a user can activate the software program package of the flash memory initialization process (or the storage unit checking process) to run the program on the processor 220 to control the flash memory controller 215 to access/write/read data of storage units of the flash memory 210 so as to check the storage units of the flash memory 210.

Initially, the controller 215 is controlled to perform the sequential read operation upon to sequentially select one storage unit and then read data from such sequentially selected storage unit each time according to the serial order numbers of the storage units. Then, the controller 215 is controlled to compare the data read from the sequentially selected storage unit with the data originally written into the sequentially selected storage unit to determine whether the sequentially selected storage unit is a good/undamaged storage unit. The controller 215 is controlled to record the check result of the sequentially selected storage unit at a corresponding field of the sequentially selected storage unit on a bad storage unit check table as 'N' to indicate that the sequentially selected storage unit has been identified or checked as a good storage unit if the sequentially selected storage unit is undamaged. Alternatively, the controller 215 is controlled to record the check result of the sequentially selected storage unit at the corresponding field of the sequentially selected storage unit as 'Y' to indicate that the sequentially selected storage unit has been identified or checked as a bad storage unit if the sequentially selected storage unit is damaged. The corresponding field before checking may be empty.

For example, an example of the bad storage unit check table may be listed in the following:

| Serial order number of storage unit | Bad storage unit |
| --- | --- |
| 1 | Y |
| 2 | N |
| 3 | Y |
| 4 | Y |
| 5 | N |
| 6 | N |
| 7 | N |
| ... | ... |

As mentioned above, 'Y' means that the storage units having the serial order numbers 1, 3, 4 have been checked as bad/damaged storage units, and 'N' means that the other storage units having the serial order numbers 2, 5, 6, 7 are checked as good/undamaged storage units. In addition, if a storage unit is not yet checked, then the corresponding field associated with such storage unit may be empty.

Then in Step 130 the controller 215 is controlled to update the number SBN of damaged storage units which are consecutive. In addition, in Step 132 the controller 215 is arranged to update the number SUN of storage units which have been checked. If the above-mentioned selected storage unit is the first storage unit having the first serial order number and is identified as a bad storage unit, the controller 215 is controlled to update the number SBN as one; in this situation, the number SUN is equal to one. Since the number SUN is smaller than the number of total storage units, the flow proceeds to Step 135.

In Step 135, the controller 215 is controlled to compare the number SBN with the threshold number TH1 such as ten (but not limited), and then the flow proceeds to Step 115 from Step 135 to sequentially select and read a next storage unit. If the number SBN is larger than the threshold number TH1, then this implies that the controller 215 may read data from a portion of the storage units according to the serial order numbers of the storage units wherein the portion of the storage units are bad/damaged storage units comprising consecutive storage units among the storage units. That is, equivalently the controller 215 may determine whether the consecutive storage units are bad storage units. If the consecutive storage units are bad storage units, i.e. the accumulated number SBN is larger than the threshold number TH1, the controller 215 is arranged to set the number SBN as zero and exit the mode of sequential read operation in Step 140. That is, when it is determined that eleven consecutive storage units are damaged, the controller 215 exit the mode of sequential read operation.

Then the controller 215 enters the mode of random read operation in Step 140. In this mode, the controller 215 in Step 145 performs the random read operation to randomly select one storage unit from the remaining storage units based on a random serial order number and then to read data from the selected storage unit. The controller 215 in Step 150 compares the data read from the selected storage unit with the data originally written into the selected storage unit to determine whether the randomly selected storage unit is a good storage unit or a bad storage unit. If the randomly selected storage unit is a good storage unit, the controller 215 is arranged to record the check result of the randomly selected storage unit at a corresponding field of the randomly selected storage unit on the bad storage unit check table as 'N' to indicate that the randomly selected storage unit has been identified or checked as an undamaged storage unit. Alternatively, if the randomly selected storage unit is not a good storage unit, the controller 215 is arranged to record the check result of the randomly selected storage unit at the corresponding field of the randomly selected storage unit as 'Y' to indicate that the randomly selected storage unit has been identified or checked as a damaged storage unit.

Then in Step 160 the controller 215 is controlled to update the number RGN; for example, the number RGN is updated as one if the randomly selected storage unit is the first storage unit selected by the random read operation. Then, in Step 165, the controller 215 is controlled to compare the updated number RGN with the threshold number TH2 to determine whether to exit the mode of random read operation. For example, if the threshold number TH2 is configured as ten and the updated number RGN now is equal to one, then the flow keeps the mode of random read operation and then proceeds to Step 170b. In Step 170B, the controlled 215 is controlled to select a next storage unit next to the first storage unit selected by the random read operation and then to read data from the selected next storage unit to compare the data read from the selected next storage unit with the data originally written into the selected next storage unit (Step 150). Similarly, the flow proceeds to Step 155A or Step 155B based on the corresponding check result and then proceeds to Step 160 and Step 165 again.

In one scenario, once the update number RGN becomes eleven which is larger than the value of threshold number TH2 (i.e. ten), this indicates that more than ten consecutive storage units read under the mode of random read operation are identified as good storage units, and the controller 215 is controlled to exit the mode of random read operation and reset the number RGN as zero. The flow then proceeds to Step 115 to enter the mode of sequential read operation and perform such operation. Once the process enters the mode of sequential read operation, the controller 215 is controlled to select a next storage unit next to the last storage unit previously selected by the random read operation and then to read data from the selected next storage unit to compare the read data with the data originally written into the selected next storage unit.

That is, the storage unit checking process can be arranged to control the controller 215 to initially perform the sequential read operation to read data from the flash memory 210 and then to exit the sequential read operation and enter the random read operation to select a specific storage unit which is not consecutive or adjacent to the previously selected storage unit(s) for data reading, so as to efficiently and effectively find or select a good/undamaged storage unit as far as possible. In addition, once the controller 215 determines that a set of currently selected storage units are good storage units, the controller 215 can be controlled to use the sequential read operation to read data from storage unit(s) which is/are adjacent to the set of currently selected storage units.

Each of the storage units can be a storage block, a storage page, or a storage sector. Taking an example of the storage units being storage blocks, the controller 215 enters the block mode, and the process initially is to sequentially check whether each storage block is a bad block or not based on the corresponding serial order numbers of the storage blocks. If the process determines that N consecutive storage blocks are bad blocks, the process is to exit the sequential read operation and then instead performs the random read operation to read data of a storage block which has a serial order number not adjacent or consecutive to those of the set of consecutive storage blocks. That is, the random read operation is arranged to randomly select a storage block from other remaining storage blocks which are not checked and then to read data from the selected storage block to check whether such selected storage block is a good storage block or not. The value of N is a positive integer.

In one embodiment, after the storage block randomly selected by the random read operation is identified as a good storage block, the process may be arranged to exit the random read operation and instead go back to the sequential read operation to read data of a storage block next to the randomly selected storage block. However, this is not intended to be a limitation. The process may perform the random read operation upon all of the remaining storage blocks once the process enters the mode of random read operation.

In one embodiment, after the random read operation is performed and the last numbered storage block has been checked, the process may be arranged to sequentially read data from remaining storage blocks which are not yet checked according to information recorded by a bad block check table which is used to record which blocks have been checked.

In one embodiment, in practice, for a specific storage block, the process is arranged to sequentially read data from the storage pages comprised within the specific storage block according to corresponding serial order numbers of the storage pages. The process then is arranged to compare corresponding data read from each storage page with the data written into the each storage page. If the data read from a storage page does not match to the data written into, the process will determine that the storage page is a bad storage page. If N storage pages of the specific block are identified as bad storage pages by the process, then the process is arranged to use a predetermined read voltage to read data from the storage pages of the specific storage block without adjusting the read voltage. This can also save the waiting time period.

If M consecutive storage pages in the same storage block are identified as bad storage pages by the process, then the process is arranged to determine that such storage block is a bad storage block wherein M is larger than N and M is smaller than a number of total storage pages comprised by such storage block.

Further, taking an example of the storage units being storage pages, the controller 215 enters the page mode, and the process is arranged to enter the page mode mentioned above and initially is arranged to sequentially check whether each storage page is a bad page or not based on the corresponding serial order numbers of the storage pages in the flash memory. If the process determines that X consecutive storage pages are bad pages, the process is to exit the sequential read operation and then instead performs the random read operation to read data of a storage page which has a serial order number not adjacent or consecutive to those of the set of consecutive storage pages. That is, the random read operation is arranged to randomly select a storage page from other remaining storage pages which are not checked and then to read data from the selected storage page to check whether such selected storage page is a good storage page or not. The value of X is a positive integer. The value of X can be identical to or different from the value of N mentioned above.

In one embodiment, after the storage page randomly selected by the random read operation is identified as a good storage page, the process may be arranged to exit the random read operation and instead go back to the sequential read operation to read data of a storage page next to the randomly selected storage page. However, this is not intended to be a limitation. The process may perform the random read operation upon all of the remaining storage pages once the process enters the mode of random read operation.

In one embodiment, after the random read operation is performed and the last numbered storage page has been checked, the process may be arranged to sequentially read data from remaining storage pages which are not yet checked according to information recorded by a bad page check table which is used to record which pages have been checked.

In one embodiment, in practice, for a specific storage page, the process is arranged to read data from the specific storage page and then compare the read data with the data originally written into the specific storage page. If the data does not match, the process can determine that the specific storage page is a bad storage page.

Similarly, if the storage units mean the storage sectors, the controller 215 enters the sector mode, and the process performs the operations mentioned above similarly. The description is not detailed for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for checking storage units of a flash memory of a flash memory device, comprising:
    writing data into the storage units; and
    performing a data read operation to read data from the storage units to compare the read data with the written data to check whether the data is correctly written into the storage units, and the data read operation comprises:
    performing a sequential read operation to sequentially select a first storage unit and to read data from the first storage unit according to serial order numbers of the storage units;
    determining whether the first storage unit is damaged;
    accumulating a number of damaged storage units which are consecutive if the first storage unit is damaged;
    determining whether the number of damaged storage units is larger than a first threshold number; and
    exiting the sequential read operation and then performing a random read operation to read data of a specific storage unit if the number of damaged storage units is larger than the first threshold number, wherein the specific storage unit has a serial order number which is not consecutive to serial order numbers of a first portion of the storage units, a serial order number of the specific storage is not consecutive to a serial order number of the first storage unit.

2. The method of claim 1, wherein the storage units are storage blocks, storage pages, or storage sectors.

3. The method of claim 1, further comprising:
    resetting the number of damaged storage units which are consecutive as zero if the first storage unit is undamaged.

4. The method of claim 1, further comprising:
    sequentially reading data of at least one second storage unit which is next and consecutive to the specific storage unit if the specific storage unit is determined as an undamaged storage unit;
    determining whether the at least one second storage unit is damaged;
    accumulating a number of undamaged storage units which are consecutive if the at least one second storage unit is undamaged;
    determining the number of undamaged storage units which are consecutive is larger than a second threshold number; and
    exiting the random read operation and then performing the sequential read operation to read data of a storage unit next to the at least one second storage unit if the number of undamaged storage units which are consecutive is larger than the second threshold number.

5. The method of claim 1, further comprising:
    resetting the number of undamaged storage units which are consecutive as zero if the at least one second storage unit is damaged.

6. The method of claim 1, further comprising:
    determining whether the specific storage unit is a last storage unit among the storage units after the random read operation is performed upon the specific storage unit; and
    exiting the random read operation and then performing the sequential read operation to read data of a remaining portion of the storage units, which are not checked, according to serial order numbers of the remaining portion of the storage units.

7. The method of claim 6, further comprising:
    using a bad storage unit table to record a check result of a storage unit; and
    performing the sequential read operation to read data of the remaining portion of the storage units according to information of the bad storage unit table.

8. The method of claim 7, wherein the check result of the storage unit on the bad storage unit table is empty if the storage unit is not checked.

9. An electronic device, comprising:
    a memory;
    an interface circuit, coupled to the memory via an internal bus, the interface circuit is to be coupled between the internal bus and a flash memory controller of a flash memory device which further comprises a flash memory;
    a processor, coupled to the memory and the interface circuit via the internal bus, for executing a storage unit checking process to control the flash memory controller to:
    write data into storage units; and
    perform a data read operation to read data from the storage units to compare the read data with the written data to check whether the data is correctly written into the storage units, and the data read operation comprises:

performing a sequential read operation to sequentially select a first storage unit and to read data from the first storage unit according to serial order numbers of the storage units;
determining whether the first storage unit is damaged;
accumulating a number of damaged storage units which are consecutive if the first storage unit is damaged;
determining whether the number of damaged storage units is larger than a first threshold number; and
exiting the sequential read operation and then performing a random read operation to read data of a specific storage unit if the number of damaged storage units is larger than the first threshold number, wherein the specific storage unit has a serial order number which is not consecutive to serial order numbers of a first portion of the storage units, a serial order number of the specific storage is not consecutive to a serial order number of the first storage unit.

10. The electronic device of claim 9, wherein the storage units are storage blocks, storage pages, or storage sectors.

11. The electronic device of claim 9, wherein the processor is arranged to control the flash memory controller to:
reset the number of damaged storage units which are consecutive as zero if the first storage unit is undamaged.

12. The electronic device of claim 9, wherein the processor is arranged to control the flash memory controller to:
sequentially read data of at least one second storage unit which is next and consecutive to the specific storage unit if the specific storage unit is determined as an undamaged storage unit;
determine whether the at least one second storage unit is damaged;
accumulate a number of undamaged storage units which are consecutive if the at least one second storage unit is undamaged;
determine the number of undamaged storage units which are consecutive is larger than a second threshold number; and
exit the random read operation and then perform the sequential read operation to read data of a storage unit next to the at least one second storage unit if the number of undamaged storage units which are consecutive is larger than the second threshold number.

13. The electronic device of claim 9, wherein the processor is arranged to control the flash memory controller to:
reset the number of undamaged storage units which are consecutive as zero if the at least one second storage unit is damaged.

14. The electronic device of claim 9, wherein the processor is arranged to control the flash memory controller to:
determine whether the specific storage unit is a last storage unit among the storage units after the random read operation is performed upon the specific storage unit; and
exit the random read operation and then performing the sequential read operation to read data of a remaining portion of the storage units, which are not checked, according to serial order numbers of the remaining portion of the storage units.

15. The electronic device of claim 14, wherein the processor is arranged to control the flash memory controller to:
use a bad storage unit table to record a check result of a storage unit; and
perform the sequential read operation to read data of the remaining portion of the storage units according to information of the bad storage unit table.

16. The electronic device of claim 15, wherein the check result of the storage unit on the bad storage unit table is empty if the storage unit is not checked.

\* \* \* \* \*